(12) United States Patent
Goff

(10) Patent No.: US 7,710,208 B2
(45) Date of Patent: May 4, 2010

(54) MULTI-SPEED RING OSCILLATOR

(75) Inventor: Lonnie C. Goff, Tempe, AZ (US)

(73) Assignee: VNS Portfolio LLC, Cupertino, CA (US)

( * ) Notice: Subject to any disclaimer, the term of this patent is extended or adjusted under 35 U.S.C. 154(b) by 0 days.

(21) Appl. No.: 11/788,035

(22) Filed: Apr. 18, 2007

(65) Prior Publication Data
US 2008/0258824 A1    Oct. 23, 2008

(51) Int. Cl.
*H03K 3/03* (2006.01)
(52) U.S. Cl. .............................. 331/57; 331/45; 331/46
(58) Field of Classification Search ................... 331/2, 331/16, 46, 45, 57; 326/93; 327/541
See application file for complete search history.

(56) References Cited

U.S. PATENT DOCUMENTS

| | | | |
|---|---|---|---|
| 4,517,532 A | 5/1985 | Neidorff | 331/57 |
| 5,416,444 A * | 5/1995 | Yamauchi et al. | 331/45 |
| 5,528,200 A | 6/1996 | Yamauchi et al. | 331/45 |
| 5,789,985 A * | 8/1998 | Yamauchi et al. | 331/1 A |
| 5,861,780 A * | 1/1999 | Fukuda | 331/57 |
| 6,020,781 A * | 2/2000 | Fujioka | 327/541 |
| 6,204,694 B1 * | 3/2001 | Sunter et al. | 326/93 |
| 6,771,134 B2 * | 8/2004 | Wong et al. | 331/57 |
| 6,985,041 B2 * | 1/2006 | Wong et al. | 331/46 |
| 7,129,772 B2 * | 10/2006 | Kim et al. | 327/536 |
| 2003/0206068 A1 * | 11/2003 | Wong et al. | 331/57 |
| 2005/0012558 A1 | 1/2005 | Marshall et al. | 331/140 |
| 2005/0195018 A1 | 9/2005 | Kim et al. | 327/536 |
| 2005/0225399 A1 * | 10/2005 | Sekimoto | 331/16 |
| 2006/0284693 A1 * | 12/2006 | Nelson | 331/57 |
| 2007/0182493 A1 * | 8/2007 | Sai et al. | 331/2 |

OTHER PUBLICATIONS

European Patent Application No. 08251383.9, Extended European Search Report dated Aug. 5, 2008.
European Patent Application No. 08251383.9, Office Action dated Jun. 8, 2009.

* cited by examiner

*Primary Examiner*—Jean B Jeanglaude
(74) *Attorney, Agent, or Firm*—Henneman & Associates, PLC; Larry E. Henneman, Jr.

(57) ABSTRACT

A ring oscillator comprises a control circuit for receiving a frequency-selection signal operative to select from at least two ring oscillator frequencies, said control circuit using said control signal to generate a first control signal and a second control signal; a primary chain of an odd number of serially connected NOT gates, said primary chain including a primary switching NOT gate responsive to the first control signal and operative to perform a logical NOT or an IGNORE function on a first oscillating input signal to generate a first output signal; and a secondary chain of serially connected NOT gates, said secondary chain logically parallel to at least said primary switching NOT gate, said secondary chain including a secondary switching NOT gate responsive to the second control signal and operative to perform a logical NOT or an IGNORE function on a second oscillating input signal to generate a second output signal.

67 Claims, 2 Drawing Sheets

MULTI-SPEED RING OSCILLATOR

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The present invention relates generally to digital circuits, and more particularly to multi-speed ring oscillators.

BACKGROUND

A ring oscillator is a device that includes an odd number of NOT gates, e.g., inverters, whose output voltage oscillates between logical high and logical low. The NOT gates of a conventional ring oscillator are attached in a circular chain, causing the output voltage of the last NOT gate of the odd number of NOT gates to be fed back as input to the first NOT gate. Because the chain includes an odd number of NOT gates, the logical voltage exiting the last NOT gate is the logical NOT of the input voltage previously entering the first NOT gate. Thus, the output voltage of each NOT gate within the loop oscillates. Since the output voltage of the last NOT gate is asserted to the first NOT gate a finite amount of time after the previous input voltage, each NOT gate oscillates at a predictable frequency.

Controlling ring oscillator frequency may be helpful to test chips for development and quality control, to facilitate power saving during dormant periods of use, to overcome manufacturing process variations, to overcome differences in chip voltage and temperature environments in applications, and/or to provide a uniform clock frequency specification.

One known technique for controlling ring oscillator frequency is to change the number of inverters in the ring. Example digital gates and semiconductor switches to bypass selected inverters of a serial ring oscillator are described for example in U.S. Pat. No. 4,517,532 to Neidorff, U.S. Pat. No. 5,689,213 to Sher, and U.S. Pat. No. 5,815,043 to Chow. Another known technique includes modifying inverter delay time. Inverters comprised of digitally selectable, parallel-connected tri-state gates, whereby the net drive strength and thus the delay of each inverter can be individually controlled, are described in U.S. Pat. No. 4,517,532 to Motoyama.

These known techniques have disadvantages and limitations that prevent widespread employment in embedded CMOS microprocessor systems, which conventionally operate at the highest possible frequency allowed by the cumulative circuit delays in the microprocessor. These known techniques are not well adapted to Electronic Design Automation (EDA) tools. These known techniques do not lend themselves to logic synthesis using standard cell libraries, and physical synthesis with standard-cell-driven layout techniques. Instead, conventional ring oscillators need custom design and layout in each case, increasing cost and practical time to implement. Further, the Motoyama '532 technique requires tri-state logic, which is incompatible with more widely used logic families for digital CMOS circuits, for which EDA tools are more readily available.

Capability to use EDA tools for ring oscillator design and layout is desirable in current semiconductor technologies for embedded CMOS microprocessor systems, which employ small line widths, e.g., 130 nm and 45 nm, where the wiring delay between stages becomes significant and can exceed the inverter gate delay due to parasitic capacitance. Further, it is desirable to ensure that frequency transitions of a ring oscillator occur without any short pulses, known as runt or splinter pulses, that can cause metastability. Bistable elements can hover between logical high and logical low for extended periods of time, interrupting or stopping normal system operation. A clock oscillator free of metastability is important for embedded microprocessor systems, since for example malfunction in real-time control systems can have serious consequences.

A multi-speed ring oscillator having a physical layout adapted for development using EDA tools, and having frequency transitions without runt pulses would therefore be desirable.

SUMMARY

Per one embodiment, the present invention provides a multi-speed ring oscillator comprising a control circuit for receiving a frequency-selection signal operative to select from at least two different ring oscillator frequencies, said control circuit using said frequency-selection signal to generate a first control signal and a second control signal; a primary chain of an odd number of serially connected NOT gates, said primary chain including a primary switching NOT gate being responsive to the first control signal and operative to perform a logical NOT function or an IGNORE function on a first oscillating input signal to generate a first output signal; and a secondary chain of serially connected NOT gates, said secondary chain being logically parallel to at least said primary switching NOT gate of said primary chain, said secondary chain including a secondary switching NOT gate being responsive to the second control signal and operative to perform a logical NOT function or an IGNORE function on a second oscillating input signal to generate a second output signal.

The frequency-selection signal may include a logical high or logical low voltage. The primary switching NOT gate may include a NAND gate. The secondary switching NOT gate may include a NAND gate. The control circuit may include a D flip-flop. The D flip-flop may have a Q output terminal coupled to provide the Q output signal to the primary switching NOT gate, and a QN output terminal coupled to provide the QN output signal to the secondary switching NOT gate. The D flip-flop may have a clock input terminal coupled to a node in the primary chain to receive an oscillating signal as a clock input signal. The primary chain may include a number of NOT gates between the node and the primary switching NOT gate to avoid runt pulses. The secondary chain may be disposed on a chip physically perpendicular to the primary chain. The primary chain may include a NAND gate for directly or indirectly receiving the first output signal from the primary switching NOT gate and the second output signal from the secondary switching NOT gate, and for using the first and second output signals to cause its output signal to oscillate in response to oscillation by one of the first output signal or the second output signal.

Per another embodiment, the present invention provides a method comprising receiving a frequency-selection signal operative to select from at least two different ring oscillator frequencies; using the frequency-selection signal to generate a first control signal and a second control signal; providing the first control signal to a primary switching NOT gate in a primary chain of an odd number of serially connected NOT gates, the primary switching NOT gate being responsive to the first control signal and operative to perform a logical NOT function or an IGNORE function on a first oscillating input signal to generate a first output signal; and providing the second control signal to a secondary switching NOT gate in a secondary chain of serially connected NOT gates, said secondary chain being logically parallel to at least said primary switching NOT gate of said primary chain, the secondary switching NOT gate being responsive to the second control signal and operative to perform a logical NOT function or an IGNORE function on a second oscillating input signal to generate a second output signal.

The frequency-selection signal of the method may include a logical high or logical low voltage. The primary switching NOT gate may include a NAND gate. The secondary switching NOT gate may include a NAND gate. The using the frequency-selection signal may include using a D flip-flop. The D flip-flop may have a Q output terminal coupled to provide the Q output signal to the primary switching NOT gate, and a QN output terminal coupled to provide the QN output signal to the secondary switching NOT gate. The D flip-flop may have a clock input terminal coupled to a node in the primary chain to receive an oscillating signal as a clock input signal. The primary chain may include a number of NOT gates between the node and the primary switching NOT gate to avoid runt pulses. The secondary chain may be disposed on a chip physically perpendicular to the primary chain. The primary chain may include a NAND gate for directly or indirectly receiving the first output signal from the primary switching NOT gate and the second output signal from the secondary switching NOT gate, and for using the first and second output signals to cause its output signal to oscillate in response to oscillation by one of the first output signal or the second output signal.

Per yet another embodiment, the present invention provides a multi-speed ring oscillator comprising means for receiving a frequency-selection signal operative to select from at least two different ring oscillator frequencies; means for using the frequency-selection signal to generate a first control signal and a second control signal; primary switching NOT gate means in a primary chain of an odd number of serially connected NOT gates, the primary switching NOT gate means being responsive to the first control signal and operative to perform a logical NOT function or an IGNORE function on a first oscillating input signal to generate a first output signal; and secondary switching NOT gate means in a secondary chain of serially connected NOT gates, said secondary chain being logically parallel to at least said primary switching NOT gate means of said primary chain, the secondary switching NOT gate being responsive to the second control signal and operative to perform a logical NOT function or an IGNORE function on a second oscillating input signal to generate a second output signal.

DETAILED DESCRIPTION

The following description is provided to enable any person skilled in the art to make and use the invention and is provided in the context of a particular application. Various modifications to the embodiments are possible, and the generic principles defined herein may be applied to these and other embodiments and applications without departing from the spirit and scope of the invention. Thus, the invention is not intended to be limited to the embodiments and applications shown, but is to be accorded the widest scope consistent with the principles, features and teachings disclosed herein.

In accordance with one embodiment, the present invention provides a multi-speed, frequency-controllable ring oscillator, which can be used for clocking embedded complementary metal oxide-semiconductor (CMOS) microprocessor systems. In one embodiment, the ring oscillator is wholly digital and includes a primary chain of NOT gates and one or more secondary chains of NOT gates. In one embodiment, a NOT gate refers to a logical device that acts to convert between a logical high voltage and a logical low voltage. An example NOT gate could include any logic device, e.g., inverter, AND gate, NAND gate, OR gate, NOR gate, XOR gate, NXOR gate, etc., so long as the logic device operates to effect a logical NOT operation when needed.

Figure 1:
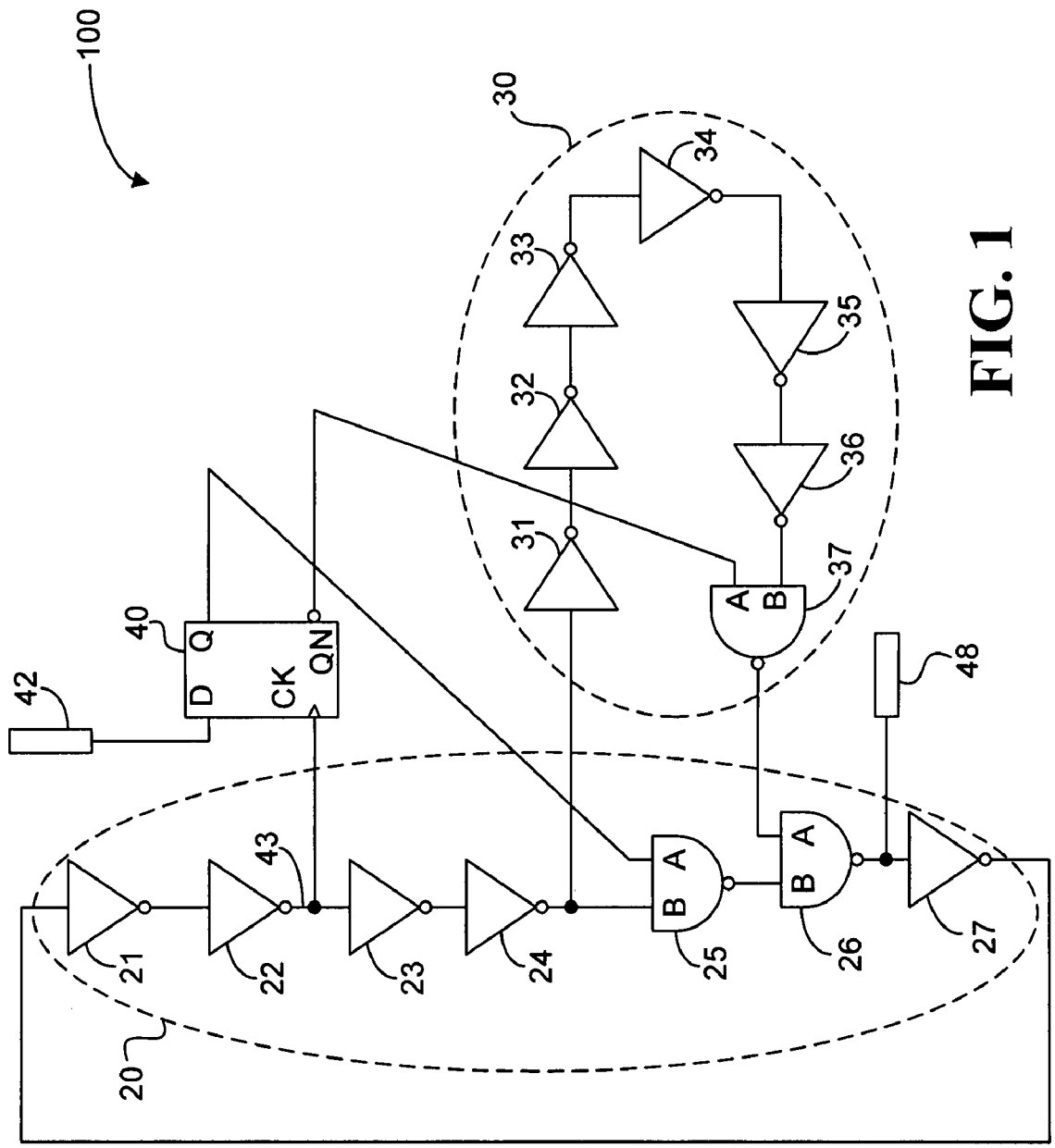
FIG. 1 is a schematic diagram of a multi-speed ring oscillator, according to an embodiment of the invention.

FIG. 1 is a circuit diagram illustrating a multi-speed ring oscillator 100, in accordance with an embodiment of the present invention. The ring oscillator 100 includes a primary chain 20 of serially connected NOT gates, and a secondary chain 30 of serially connected NOT gates logically parallel to at least one of the NOT gates of the primary chain 20. In one embodiment, the secondary chain 30 is disposed physically perpendicular to the primary chain 20 in its chip layout. A higher frequency of oscillation occurs when the switching path effectively includes only the NOT gates of the primary chain 20 (referred to herein as the "short path"). A lower frequency of oscillation occurs when the switching path effectively includes the NOT gates of the primary chain 20 (minus the one or more NOT gates logically parallel to the secondary chain 30) and the secondary chain 30 (referred to herein as the "long path"). In the illustrated embodiment, the secondary chain 30 may be logically parallel to one NOT gate of the primary chain 20. However, in other embodiments, the secondary chain 30 may be logically parallel to more than one NOT gate of the primary chain 20.

In the illustrated embodiment, the primary chain 20 includes inverting gates 21, 22, 23 and 24, NAND gates 25 and 26, and inverting gate 27, serially connected in a ring. The secondary chain 30 includes serially connected inverting gates 31, 32, 33, 34, 35 and 36 and NAND gate 37. The input terminal of gate 31 of the secondary chain 30 is coupled to the output terminal of inverting gate 24 of the primary chain 20, and the output terminal of NAND gate 37 of the secondary chain 30 is coupled to the A-input of NAND gate 26 of the primary chain 20. Accordingly, in this embodiment, the secondary chain 30 is logically parallel to the NAND gate 25.

The ring oscillator 100 further includes a control circuit for controlling whether the short path (i.e., the primary chain 20 alone) or the long path (i.e., the primary chain 20 minus the NAND gate 25 in combination with the secondary chain 30) functions as the switching path. The control circuit may include a D flip-flop 40 coupled to receive a frequency-selection control voltage at its D input terminal from an input node 42 and to receive a clock signal at its clock input terminal. The D flip-flop 40 may further be coupled to provide a first control voltage (equivalent of the frequency-selection control voltage received at the D input terminal) from its Q output terminal to the A-input terminal of the NAND gate 25, and to provide a second control voltage (the logical NOT of the first control voltage) from its QN terminal to the A-input of the NAND gate 37. The D flip-flop 40 controls the operation of the NAND gate 25 and the NAND gate 37 to effectively select the short path or the long path. Accordingly, each of the NAND gate 25 and the NAND gate 37 may be generally referred to herein as a switching NOT gate, in this embodiment, switching between a NOT function and an IGNORE function as described below.

The ring oscillator 100 operates generally as follows: The D flip-flop 40 receives a frequency-selection control signal at its D input terminal to enable one of the short path or the long path. Since each of the short path and the long path contains an odd number of NOT gates, the voltage at any one node in the operative path, e.g., at the output terminal 48, oscillates at a frequency determined by the total delay around the operative path.

More particularly, when a logical high voltage is asserted at input terminal 42, a logical high voltage is transferred at subsequent clock transitions from the Q output terminal of the D flip-flop 40 to the A-input terminal of the NAND gate 25 of the primary chain 20, and a logical low voltage is concurrently transferred from the QN output terminal of the D flip-flop 40 to the A-input terminal of NAND gate 37 of the secondary chain 30. With a logical high voltage asserted at the A-input terminal of the NAND gate 25, the B-input terminal and output terminal of the NAND gate 25 operate as a NOT gate. With a logical low voltage asserted at the A-input terminal of the NAND gate 37, its output voltage becomes logical high regardless of its B-input voltage. Thus, NAND gate 37 performs an IGNORE function, generating a fixed logical signal, in this case a fixed logical high output voltage, to the A-input terminal of NAND gate 26 despite any voltage oscillation occurring at its B-input terminal. With a fixed logical high voltage asserted at the A-input terminal of the NAND gate 26, the B-input terminal and output terminal of the NAND gate 26 operate as a NOT gate. Accordingly, voltage oscillation occurs only within the short path. The ring oscillator 100 provides an output signal at output terminal 48 that has a frequency $f_H$ corresponding to the total delay of the gates 21-27 of the primary chain 20 and their interconnecting wiring.

Further, when a logical low voltage is asserted at input terminal 42, a logical low voltage is transferred at subsequent clock transitions from the Q output terminal of the D flip-flop 40 to the A-input terminal of the NAND gate 25 of the primary chain 20, and a logical high voltage is concurrently transferred from the QN output terminal of the D flip-flop 40 to the A-input terminal of the NAND gate 37. With a logical low voltage asserted at the A-input terminal of the NAND gate 25, its output voltage becomes logical high regardless of its B-input voltage. Thus, NAND gate 25 performs an IGNORE function, generating a fixed logical signal, in this case a fixed logical high output voltage, to the B-input of the NAND gate 26 despite any voltage oscillation occurring at the A-input terminal. With a logical high voltage asserted at the B-input terminal of NAND gate 26, the A-input terminal and output terminal of the NAND gate 26 operate as a NOT gate. With a logical high voltage asserted at the A-input terminal of the NAND gate 37, the B-input terminal and the output terminal of the NAND gate 37 operate as a NOT gate. Accordingly, voltage oscillation occurs within the long path, i.e., through the primary chain 20 (without the NAND gate 25) and through the secondary chain 30. The ring oscillator 100 provides an output signal at output terminal 48 that has a lower frequency $f_L$ corresponding to the total delay of gates 21-24, gates 31-37, gates 26 and 27 and the interconnecting wiring.

Frequency of the ring oscillator 100 at output terminal 48 is selectable between $f_H$ and $f_L$ by applying a logical high voltage or a logical low voltage to input terminal 42. In one embodiment, the oscillating output voltage can be measured at an output node 48, which in the illustrated embodiment includes the output terminal of the NAND gate 26. It will be appreciated that NAND gate 26 always receives a fixed logical high voltage and an oscillating voltage at it's A-input and B-input terminals. Accordingly, in this embodiment, NAND gate 26 operates as a NOT gate at all times.

In one embodiment of the invention, the switching between an oscillating output signal generated by NAND gate 25 and an oscillating output signal generated by NAND gate 37 is adapted to occur at a fixed phase point of the oscillating voltage signal in the ring oscillator 100. In one embodiment, the clock input terminal of D flip-flop 40 obtains its clock signal from node 43, i.e., the output terminal of inverter gate 22. Thus, frequency switching between the short path and the long path occurs synchronously with a clock transition.

Care should be taken in the design to ensure that the control circuit, e.g., the D flip-flop 40, is synchronized not to turn on or off in a state that prevents it from being turned off or on again. The clock input signal is preferably designed to cause the ring oscillator 100 to switch between high and low frequencies without causing any runt pulses that can cause the circuits to become metastable, e.g., locked into an undesirable state. For example, for a positive edge-triggered D flip-flop 40, the delay time between a logical low voltage to logical high voltage transition at the node 43, and a logical high voltage to logical low voltage transition of the A-input terminal of NAND gate 25 which would occur after the control voltage at input terminal 42 changes from logical high voltage to logical low voltage, would be the clock-to-output delay of the D flip-flop 40 plus associated wire delays. By adjusting the number of NOT gates between node 43 and the B-input terminal of NAND gate 25, shown to be two (2) in FIG. 1, and knowing their delays compared to the clock-to-output delay plus associated wire delays, the logical high voltage to logical low voltage transition of the A-input of NAND gate 25 can be adjusted to occur while the B-input terminal is a logical high voltage, thus avoiding early transition of the oscillating signal and avoiding possible runt pulses. Other circuits employing standard digital gates can alternatively be used to synchronize the primary chain 20 oscillating signal with the dynamic state of the ring oscillator 100, with appropriate circuit changes.

In the interest of clarity, supply voltage and ground connections are not shown in FIG. 1. Further, while FIG. 1 depicts circuit elements and their electrical interconnections using standard schematic diagram conventions and symbols, it further illustrates general features of the physical layout of the gates on a semiconductor surface, but not to scale. One feature of the layout includes the perpendicular disposition of the primary chain 20 with respect to the secondary chain 30.

The ring oscillator 100 shown is fully digital in design. The ring oscillator 100 can be implemented with standard cell gates, as opposed to other types of gates, e.g., pass-through logic gates. Accordingly, EDA tools may be used for its design and construction, e.g., as part of an embedded CMOS microprocessor system on one chip. The NOT gates, e.g., inverters 21-24, 27 and 31-36, NAND gates 25, 26 and 37, and D flip-flop 40 may be selected from a standard cell library, for example the SAGE-X™ Standard Cell Library for TSMC's logical low voltage. 18 μm process offered by ARM Ltd, wherein the INV cell can be selected for said inverting gates, the NAND2 cell for said NAND gates, and the DFF cell for said D flip-flop, with available optional attributes of the cell chosen appropriately for the application. Other cell libraries for other foundries and semiconductor process families may additionally or alternatively be used. Automated logic synthesis, place, and route programs available, e.g., from Cadence Design Systems, Inc., Magma Design Automation, Inc., and/or Synopsys, Inc. can be used to implement a the ring oscillator 100 by employing standard cells and to incorporate it in an embedded microprocessor system. Embodiments of the invention may facilitate implementation of ring oscillators 100 without the need for highly skilled custom CMOS physical layout engineers.

In other embodiments, the ring oscillator 100 can have fewer or more NOT gates in the primary chain 20 and in the secondary chain 30 than as shown. Further, the ring oscillator 100 can have additional secondary chains 30 connected at different places along the primary chain 20, with appropriate control circuit changes. Further, the ring oscillator 100 can have a hierarchy of more than one level of secondary chain 30. For example, the secondary chain 30 of the ring oscillator 100 may itself have its own secondary chain (not shown). The secondary chain 30 may have an even number of NOT gates, e.g., when the number of NOT gates in the primary chain 20 with which it is logically parallel is also an even number, so long as the number of NOT gates in any ring oscillator path is an odd number to ensure voltage oscillation. The primary chain 20 may have more than one tap. Another control device or combination of devices can replace the D flip-flop 40. Software may be capable to dynamically switch NOT gates in and out. Software may be capable to reduce power in those applications when a slower clock (and its corresponding economy of power) is sufficient to accomplish a desired task.

Figure 2:
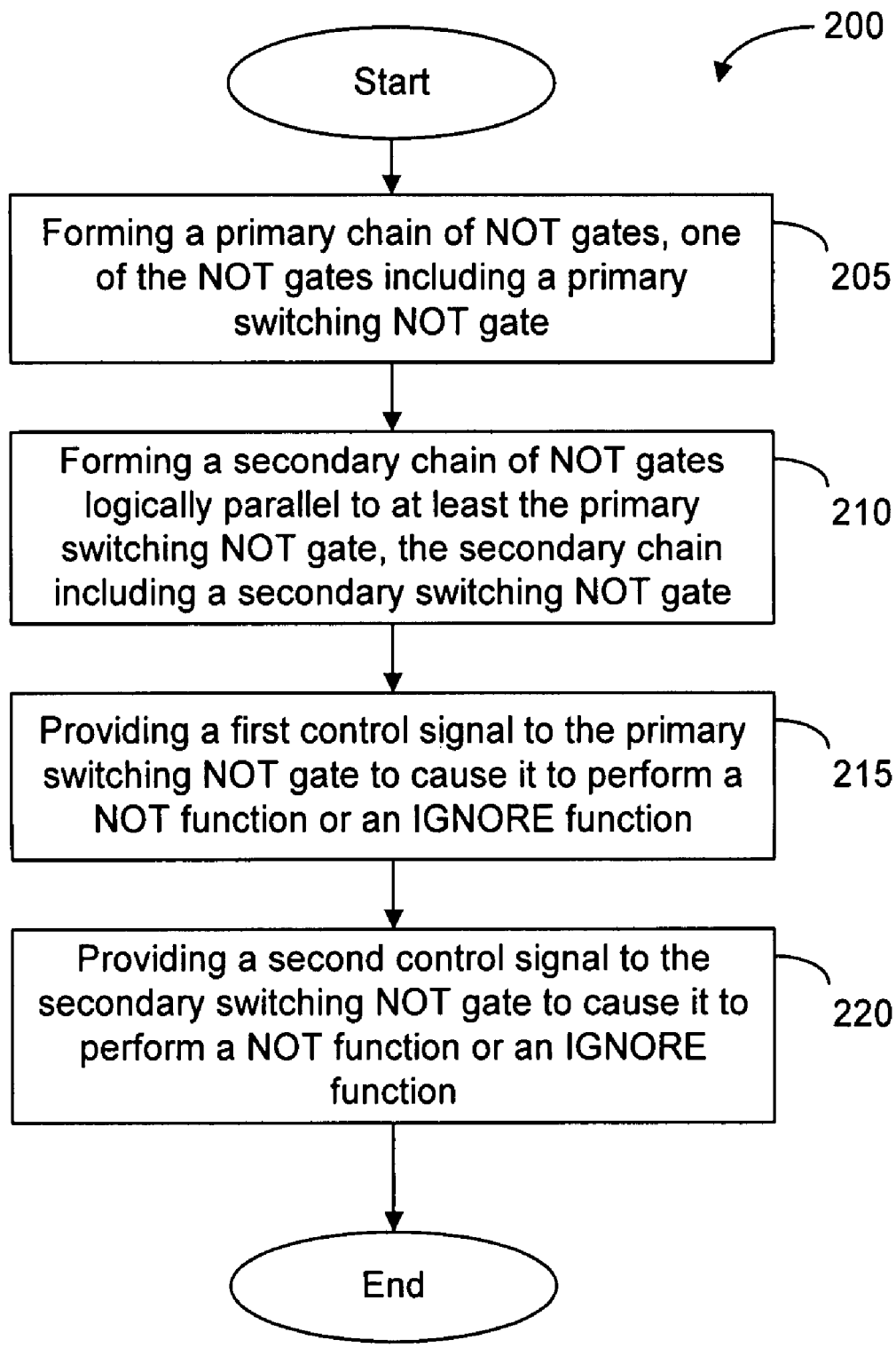
FIG. 2 is a flowchart illustrating a method of forming and using a multi-speed ring oscillator, in accordance with an embodiment of the present invention.

FIG. 2 is a flowchart illustrating a method 200 of forming and using a multi-speed ring oscillator, in accordance with an embodiment of the present invention. Method 200 begins in step 205 by forming a primary chain of NOT gates, one of the NOT gates including a primary switching NOT gate (e.g., a NAND gate). In step 205, a secondary chain of NOT gates is formed logically parallel to at least the primary switching NOT gate, the secondary chain including a secondary switching NOT gate. Steps 205 and 210 may be implemented using EDA tools and conventional cell libraries. In step 215, a first control signal is provided to the primary switching NOT gate to cause the primary switching NOT gate to perform a NOT function or an IGNORE function. In step 220, a second control signal is provided to the secondary switching NOT gate to case the secondary switching NOT gate to perform a NOT function or an IGNORE function. By causing only one of the primary switching NOT gate or the secondary switching NOT gate to operate at a time, the switching path can effectively be modified, so that a different frequency of oscillation can be selected. Method 200 then ends.

The foregoing description of the preferred embodiments of the present invention is by way of example only, and other variations and modifications of the above-described embodiments and methods are possible in light of the foregoing teaching. The various embodiments set forth herein may be implemented utilizing hardware, software, or any desired combination thereof. For that matter, any type of logic may be utilized which is capable of implementing the various functionality set forth herein. Components may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

I claim:

1. A multi-speed ring oscillator comprising:
    a control circuit for receiving a frequency-selection signal operative to select from at least two different ring oscillator frequencies of an oscillating signal, said control circuit using said frequency-selection signal to generate a first control signal and a second control signal;
    a primary chain of an odd number of serially connected NOT gates, said primary chain including a primary switching NOT gate being responsive to the first control signal and operative to perform a logical NOT function or an IGNORE function on a first oscillating input signal to generate a first output signal; and
    a secondary chain of serially connected NOT gates, said secondary chain being logically parallel to at least said primary switching NOT gate of said primary chain, said secondary chain including a secondary switching NOT gate being responsive to the second control signal and operative to perform a logical NOT function or an IGNORE function on a second oscillating input signal to generate a second output signal; and wherein
    responsive to said first control signal, said oscillating signal has a first frequency that depends on a first number of NOT gates; and
    responsive to said second control signal, said oscillating signal has a second frequency that depends on a second number of NOT gates, said second number of NOT gates being different than said first number of NOT gates.

2. The oscillator of claim 1, wherein the frequency-selection signal includes a logical high or logical low voltage.

3. The oscillator of claim 1, wherein the primary switching NOT gate includes a NAND gate.

4. The oscillator of claim 1, wherein the secondary switching NOT gate includes a NAND gate.

5. The oscillator of claim 1, wherein the control circuit includes a D flip-flop.

6. The oscillator of claim 5, wherein the D flip-flop has a Q output terminal coupled to provide the Q output signal to the primary switching NOT gate, and a QN output terminal coupled to provide the QN output signal to the secondary switching NOT gate.

7. The oscillator of claim 5, wherein the D flip-flop has a clock input terminal coupled to a node in the primary chain to receive said oscillating signal as a clock input signal.

8. The oscillator of claim 7, wherein the primary chain includes one or more NOT gates between the node and the primary switching NOT gate to avoid runt pulses.

9. The oscillator of claim 1, wherein the secondary chain is disposed on a chip physically perpendicular to the primary chain.

10. The oscillator of claim 1, wherein the primary chain includes a NAND gate for directly or indirectly receiving the first output signal from the primary switching NOT gate and the second output signal from the secondary switching NOT gate, and for using the first and second output signals to cause its output signal to oscillate in response to oscillation by one of the first output signal or the second output signal.

11. A method comprising:
    receiving a frequency-selection signal operative to select from at least two different ring oscillator frequencies of an oscillating signal;
    using the frequency-selection signal to generate a first control signal and a second control signal;
    providing the first control signal to a primary switching NOT gate in a primary chain of an odd number of serially connected NOT gates, the primary switching NOT gate being responsive to the first control signal and operative to perform a logical NOT function or an IGNORE function on a first oscillating input signal to generate a first output signal; and providing the second control signal to a secondary switching NOT gate in a secondary chain of serially connected NOT gates, said secondary chain being logically parallel to at least said primary switching NOT gate of said primary chain, the secondary switching NOT gate being responsive to the second control signal and operative to perform a logical NOT function or an IGNORE function on a second oscillating input signal to generate a second output signal; and wherein responsive to said first control signal, said oscillating signal has a first frequency that depends on a first number of NOT gates; and responsive to said second control signal, said oscillating signal has a second frequency that depends on a second number of NOT gates, said second number of NOT gates being different than said first number of NOT gates.

12. The method of claim 11, wherein the frequency-selection signal includes a logical high or logical low voltage.

13. The method of claim 11, wherein the primary switching NOT gate includes a NAND gate.

14. The method of claim 11, wherein the secondary switching NOT gate includes a NAND gate.

15. The method of claim 11, wherein the using the frequency-selection signal includes using a D flip-flop.

16. The method of claim 15, wherein the D flip-flop has a Q output terminal coupled to provide the Q output signal to the primary switching NOT gate, and a QN output terminal coupled to provide the QN output signal to the secondary switching NOT gate.

17. The method of claim 15, wherein the D flip-flop has a clock input terminal coupled to a node in the primary chain to receive said oscillating signal as a clock input signal.

18. The method of claim 17, wherein the primary chain includes one or more NOT gates between the node and the primary switching NOT gate to avoid runt pulses.

19. The method of claim 11, wherein the secondary chain is disposed on a chip physically perpendicular to the primary chain.

20. The method of claim 11, wherein the primary chain includes a NAND gate for directly or indirectly receiving the first output signal from the primary switching NOT gate and the second output signal from the secondary switching NOT gate, and for using the first and second output signals to cause its output signal to oscillate in response to oscillation by one of the first output signal or the second output signal.

21. A multi-speed ring oscillator comprising:
means for receiving a frequency-selection signal operative to select from at least two different ring oscillator frequencies of an oscillating signal;
means for using the frequency-selection signal to generate a first control signal and a second control signal;
primary switching NOT gate means in a primary chain of an odd number of serially connected NOT gates, the primary switching NOT gate means being responsive to the first control signal and operative to perform a logical NOT function or an IGNORE function on a first oscillating input signal to generate a first output signal; and
secondary switching NOT gate means in a secondary chain of serially connected NOT gates, said secondary chain being logically parallel to at least said primary switching NOT gate means of said primary chain, the secondary switching NOT gate being responsive to the second control signal and operative to perform a logical NOT function or an IGNORE function on a second oscillating input signal to generate a second output signal; and wherein responsive to said first control signal, said oscillating signal has a first frequency that depends on a first number of NOT gates; and responsive to said second control signal, said oscillating signal has a second frequency that depends on a second number of NOT gates, said second number of NOT gates being different than said first number of NOT gates.

22. The oscillator of claim 1, wherein:
said control circuit includes a clock input terminal coupled to a node in said primary chain to receive said oscillating signal as a clock input signal; and
said control circuit generates said first control signal and said second control signal in synchronization with transitions in the value of said clock input signal.

23. The method of claim 11, wherein using said frequency-selection signal includes:
receiving said oscillating signal as a clock input signal; and
generating said first control signal and said second control in synchronization with transitions in the value of said clock input signal.

24. A multi-speed ring oscillator comprising:
a control circuit for receiving a frequency-selection signal operative to select from at least two different ring oscillator frequencies of an oscillating signal, said control circuit using said frequency-selection signal to generate a first control signal and a second control signal;
a primary chain of an odd number of serially connected NOT gates, said primary chain including a primary switching NOT gate being responsive to the first control signal and operative to perform a logical NOT function or an IGNORE function on a first oscillating input signal to generate a first output signal; and
a secondary chain of serially connected NOT gates, said secondary chain being logically parallel to at least said primary switching NOT gate of said primary chain, said secondary chain including a secondary switching NOT gate being responsive to the second control signal and operative to perform a logical NOT function or an IGNORE function on a second oscillating input signal to generate a second output signal; and wherein responsive to said first control signal, said oscillating signal oscillates through a number of NOT gates; and responsive to said second control signal, said oscillating signal oscillates through a different number of NOT gates.

25. The oscillator of claim 24, wherein the frequency-selection signal includes a logical high or logical low voltage.

26. The oscillator of claim 24, wherein the primary switching NOT gate includes a NAND gate.

27. The oscillator of claim 24, wherein the secondary switching NOT gate includes a NAND gate.

28. The oscillator of claim 24, wherein the control circuit includes a D flip-flop.

29. The oscillator of claim 28, wherein the D flip-flop has a Q output terminal coupled to provide the Q output signal to the primary switching NOT gate, and a QN output terminal coupled to provide the QN output signal to the secondary switching NOT gate.

30. The oscillator of claim 28, wherein the D flip-flop has a clock input terminal coupled to a node in the primary chain to receive said oscillating signal as a clock input signal.

31. The oscillator of claim 30, wherein the primary chain includes one or more NOT gates between the node and the primary switching NOT gate to avoid runt pulses.

32. The oscillator of claim 24, wherein the secondary chain is disposed on a chip physically perpendicular to the primary chain.

33. The oscillator of claim 24, wherein the primary chain includes a NAND gate for directly or indirectly receiving the first output signal from the primary switching NOT gate and the second output signal from the secondary switching NOT gate, and for using the first and second output signals to cause its output signal to oscillate in response to oscillation by one of the first output signal or the second output signal.

34. The oscillator of claim 24, wherein:
said control circuit includes a clock input terminal coupled to a node in said primary chain to receive said oscillating signal as a clock input signal; and
said control circuit generates said first control signal and said second control signal in synchronization with transitions in the value of said clock input signal.

35. A method comprising:
receiving a frequency-selection signal operative to select from at least two different ring oscillator frequencies of an oscillating signal;
using the frequency-selection signal to generate a first control signal and a second control signal;
providing the first control signal to a primary switching NOT gate in a primary chain of an odd number of serially connected NOT gates, the primary switching NOT gate being responsive to the first control signal and operative to perform a logical NOT function or an IGNORE function on a first oscillating input signal to generate a first output signal; and
providing the second control signal to a secondary switching NOT gate in a secondary chain of serially connected NOT gates, said secondary chain being logically parallel to at least said primary switching NOT gate of said primary chain, the secondary switching NOT gate being responsive to the second control signal and operative to perform a logical NOT function or an IGNORE function on a second oscillating input signal to generate a second output signal; and wherein
responsive to said first control signal, said oscillating signal oscillates through a number of NOT gates; and
responsive to said second control signal, said oscillating signal oscillates through a different number of NOT gates.

36. The method of claim 35, wherein the frequency-selection signal includes a logical high or logical low voltage.

37. The method of claim 35, wherein the primary switching NOT gate includes a NAND gate.

38. The method of claim 35, wherein the secondary switching NOT gate includes a NAND gate.

39. The method of claim 35, wherein the using the frequency-selection signal includes using a D flip-flop.

40. The method of claim 39, wherein the D flip-flop has a Q output terminal coupled to provide the Q output signal to the primary switching NOT gate, and a QN output terminal coupled to provide the QN output signal to the secondary switching NOT gate.

41. The method of claim 39, wherein the D flip-flop has a clock input terminal coupled to a node in the primary chain to receive said oscillating signal as a clock input signal.

42. The method of claim 41, wherein the primary chain includes one or more NOT gates between the node and the primary switching NOT gate to avoid runt pulses.

43. The method of claim 35, wherein the secondary chain is disposed on a chip physically perpendicular to the primary chain.

44. The method of claim 35, wherein the primary chain includes a NAND gate for directly or indirectly receiving the first output signal from the primary switching NOT gate and the second output signal from the secondary switching NOT gate, and for using the first and second output signals to cause its output signal to oscillate in response to oscillation by one of the first output signal or the second output signal.

45. The method of claim 35, wherein using said frequency-selection signal includes:
receiving said oscillating signal as a clock input signal; and
generating said first control signal and said second control in synchronization with transitions in the value of said clock input signal.

46. A multi-speed ring oscillator comprising:
a control circuit for receiving a frequency-selection signal operative to select from at least two different ring oscillator frequencies of an oscillating signal, said control circuit using said frequency-selection signal to generate a first control signal and a second control signal;
a primary chain of an odd number of serially connected NOT gates, said primary chain including a primary switching NOT gate being responsive to the first control signal and operative to perform a logical NOT function or an IGNORE function on a first oscillating input signal to generate a first output signal; and
a secondary chain of serially connected NOT gates, said secondary chain being logically parallel to at least said primary switching NOT gate of said primary chain, said secondary chain including a secondary switching NOT gate being responsive to the second control signal and operative to perform a logical NOT function or an IGNORE function on a second oscillating input signal to generate a second output signal; and wherein
responsive to said first control signal, said oscillating signal oscillates around a first ring of NOT gates; and
responsive to said second control signal, said oscillating signal oscillates around a larger ring of NOT gates.

47. The oscillator of claim 46, wherein the frequency-selection signal includes a logical high or logical low voltage.

48. The oscillator of claim 46, wherein the primary switching NOT gate includes a NAND gate.

49. The oscillator of claim 46, wherein the secondary switching NOT gate includes a NAND gate.

50. The oscillator of claim 46, wherein the control circuit includes a D flip-flop.

51. The oscillator of claim 50, wherein the D flip-flop has a Q output terminal coupled to provide the Q output signal to the primary switching NOT gate, and a QN output terminal coupled to provide the QN output signal to the secondary switching NOT gate.

52. The oscillator of claim 50, wherein the D flip-flop has a clock input terminal coupled to a node in the primary chain to receive said oscillating signal as a clock input signal.

53. The oscillator of claim 52, wherein the primary chain includes one or more NOT gates between the node and the primary switching NOT gate to avoid runt pulses.

54. The oscillator of claim 46, wherein the secondary chain is disposed on a chip physically perpendicular to the primary chain.

55. The oscillator of claim 46, wherein the primary chain includes a NAND gate for directly or indirectly receiving the first output signal from the primary switching NOT gate and the second output signal from the secondary switching NOT gate, and for using the first and second output signals to cause its output signal to oscillate in response to oscillation by one of the first output signal or the second output signal.

56. The oscillator of claim 46, wherein:
said control circuit includes a clock input terminal coupled to a node in said primary chain to receive said oscillating signal as a clock input signal; and said control circuit generates said first control signal and said second control signal in synchronization with transitions in the value of said clock input signal.

57. A method comprising:
receiving a frequency-selection signal operative to select from at least two different ring oscillator frequencies of an oscillating signal;
using the frequency-selection signal to generate a first control signal and a second control signal;
providing the first control signal to a primary switching NOT gate in a primary chain of an odd number of serially connected NOT gates, the primary switching NOT gate being responsive to the first control signal and operative to perform a logical NOT function or an IGNORE function on a first oscillating input signal to generate a first output signal; and
providing the second control signal to a secondary switching NOT gate in a secondary chain of serially connected NOT gates, said secondary chain being logically parallel to at least said primary switching NOT gate of said primary chain, the secondary switching NOT gate being responsive to the second control signal and operative to perform a logical NOT function or an IGNORE function on a second oscillating input signal to generate a second output signal; and wherein
responsive to said first control signal, said oscillating signal oscillates around a first ring of NOT gates; and
responsive to said second control signal, said oscillating signal oscillates around a larger ring of NOT gates.

58. The method of claim 57, wherein the frequency-selection signal includes a logical high or logical low voltage.

59. The method of claim 57, wherein the primary switching NOT gate includes a NAND gate.

60. The method of claim 57, wherein the secondary switching NOT gate includes a NAND gate.

61. The method of claim 57, wherein the using the frequency-selection signal includes using a D flip-flop.

62. The method of claim 61, wherein the D flip-flop has a Q output terminal coupled to provide the Q output signal to the primary switching NOT gate, and a QN output terminal coupled to provide the QN output signal to the secondary switching NOT gate.

63. The method of claim 61, wherein the D flip-flop has a clock input terminal coupled to a node in the primary chain to receive said oscillating signal as a clock input signal.

64. The method of claim 63, wherein the primary chain includes one or more NOT gates between the node and the primary switching NOT gate to avoid runt pulses.

65. The method of claim 57, wherein the secondary chain is disposed on a chip physically perpendicular to the primary chain.

66. The method of claim 57, wherein the primary chain includes a NAND gate for directly or indirectly receiving the first output signal from the primary switching NOT gate and the second output signal from the secondary switching NOT gate, and for using the first and second output signals to cause its output signal to oscillate in response to oscillation by one of the first output signal or the second output signal.

67. The method of claim 57, wherein using said frequency-selection signal includes:
receiving said oscillating signal as a clock input signal; and
generating said first control signal and said second control in synchronization with transitions in the value of said clock input signal.

* * * * *